US006235685B1

United States Patent
Maeda et al.

(10) Patent No.: US 6,235,685 B1
(45) Date of Patent: May 22, 2001

(54) PRODUCTION METHOD OF JOINTS OF SUPERCONDUCTING OXIDE AND NORMAL CONDUCTOR

(75) Inventors: Junya Maeda; Teruo Izumi; Yuichi Imagawa; Satoshi Matsuoka; Yuh Shiohara; Shoji Tanaka, all of Tokyo; Hiroshi Okamoto, Fukuoka, all of (JP)

(73) Assignee: International Superconductivity Technology Center, Tokyo (JP)

( * ) Notice: Subject to any disclaimer, the term of this patent is extended or adjusted under 35 U.S.C. 154(b) by 0 days.

(21) Appl. No.: 09/439,286

(22) Filed: Nov. 15, 1999

(30) Foreign Application Priority Data

Nov. 13, 1998 (JP) .................................................. 10-323951
Mar. 2, 1999 (JP) .................................................. 11-053970

(51) Int. Cl.$^7$ .............................. H01B 12/00; B05D 1/18; B05D 5/12; B05D 3/02; B05D 7/20
(52) U.S. Cl. ...................... 505/470; 505/236; 505/434; 505/452; 505/740; 505/741; 505/821; 427/62; 427/63; 427/125; 427/374.4; 427/383.5; 427/431
(58) Field of Search ..................................... 505/236, 434, 505/452, 470, 740, 741, 821; 427/62, 63, 125, 374.4, 383.5, 431

(56) References Cited

U.S. PATENT DOCUMENTS 5,648,319 * 7/1997 Morita et al. ........................ 505/230

FOREIGN PATENT DOCUMENTS 4-269405 * 9/1992 (JP) .

OTHER PUBLICATIONS

Sato et al., "High Jc Silver–Sheathed Bi–Based Superconducting Wires", IEEE Transactions on Magnetics, vol. 27, No. 2, pp. 1231–1238, Mar. 1991.*

Tzeng, "Fabrication of Electrical Contacts to YBa2Cu3O7–x Superconductor by Molten Silver Processing", Journal of the Electrochemical Society, vol. 135, No. 5, pp. 1309–1310, May 1988.*

J. Ekin, "Method for Making Low–resistivity Contacts to High Tc Superconductors,". Appl. Phys. Lett., 52(4), 331–333 (Jan. 1988).

* cited by examiner

Primary Examiner—Shrive Beck
Assistant Examiner—Michael Barr
(74) Attorney, Agent, or Firm—Wenderoth, Lind & Ponack, L.L.P.

(57) ABSTRACT

A rod 1 made of superconducting oxide is soaked in a molten normal conductor 2 to join the rod 1 and the normal conductor 2, whereby a superconducting oxide current lead is prepared. As a result, a contact resistance at the interface between the superconducting oxide and the normal conductor can be reduced. Consequently, Joule's heat at a current lead having a small cross sectional area can be suppressed low, which in turn realizes the reduction of the load on a freezer and the amount of evaporated cooling solvent, with respect to a superconducting coil.

26 Claims, 4 Drawing Sheets

PRODUCTION METHOD OF JOINTS OF SUPERCONDUCTING OXIDE AND NORMAL CONDUCTOR

TECHNICAL FIELD OF THE INVENTION

The present invention relates to a production method of a joint comprising a superconducting oxide and a normal conductor attached to an end of the oxide. More particularly, the present invention relates to a production method of a joint preferably used as a current lead made of superconducting oxide. The superconducting oxide generally includes one that has undergone an oxygen introduction treatment and one that has not. In the present invention, therefore, the oxide that has not undergone this treatment is referred to as a precursor and the oxide that has undergone this treatment is referred to as an $O_2$-treated conductor.

BACKGROUND OF THE INVENTION

In general, a superconducting coil is cooled with a cooling solvent (e.g., liquid helium) or in an ultra-low temperature freezer and used at an extremely low temperature, during which a current is supplied to the coil through a current lead made of a normal conductor. Therefore, evaporation of the cooling solvent and low operation efficiency of the freezer both due to a heat load on the normal conductor current lead pose problems. The heat load due to the current lead is roughly divided into an invasion heat from the outside that is transmitted through the current lead and Joule's heat generated in the current lead when a current is flown.

For these two kinds of heat loads to be reduced simultaneously, a superconducting oxide ($O_2$-treated conductor) fiber has been conventionally used as the material of a current lead (hereinafter this current lead is to be referred to as a superconducting oxide current lead). A superconducting oxide ($O_2$-treated conductor) shows heat conduction performance as that of ceramic, which is characteristically strikingly smaller than that of a metal. In terms of electric conduction, unlike a metal which conducts by the transmission of a free electron, since Cooper pair is involved, a flow of a current up to a certain level (critical current value) does not cause degradation of superconductivity in the absence of resistance. In other words, a flow of a current does not cause generation of Joule's heat. Therefore, a current lead composed of a superconducting oxide fiber can realize both superior electric conduction and reduction of invasion heat.

Bi superconducting oxide, which is easily produced, has been heretofore used as a material of a superconducting oxide current lead. However, since critical current density (maximum current flowable in a superconducting state) of a Bi superconducting oxide bulk is as small as approximately 1000 A/cm$^2$, the resulting lead is required to have a large sectional area to accept a desired current. For example, when the current of 1000 A is to be flown, the lead should have a diameter of about 12 mm.

The present inventors have succeeded in obtaining a single crystal bulk of an RE123 superconductor (rare earth superconducting oxide) having a critical current density of 70,000 A/cm$^2$ and produced by a unidirectional solidification method (Y. Imagawa et al., Physica C280 (1997) 255). Such a markedly high critical current density means capability of producing a superconducting oxide current lead that affords necessary current value with a small cross sectional area. For example, a current lead having a diameter of 1.3 mm and a smaller cross sectional area can accept a flow of the aforementioned 1000 A current.

The use of such an RE123 superconducting current lead enables reduction of a space. The amount of the heat that invades from outside through a current lead is in proportion to a cross sectional area and an inverse proportion to a length. Therefore, the use of an RE123 oxide superconducting current lead brings about further reduction of invasion of heat, thereby reducing the load on a freezer and further reducing the amount of evaporated cooling solvent.

Even when a superconducting oxide current lead is used, its terminal needs to be connected to a regular copper wire. However, for a high current to be flown, a terminal of a metal (normal conductor) should be attached.

In the case of a Bi superconducting oxide current lead, a terminal is formed by sputtering of a metal on a superconductor. In this sputtering method, the contact resistance at the interface between the superconducting oxide ($O_2$-treated conductor) and a terminal is as high as approximately $10^{-9}$ $\Omega m^2$ (J. W. Ekin et al. Appl. Phys. Lett 52 (1998) 331). A Bi superconducting oxide current lead does not suffer much from the contact resistance because of a large contact area between the terminal and the superconducting oxide ($O_2$-treated conductor), wherein less Joule's heat is generated due to the contact resistance at the interface.

When a terminal is formed in the same manner as in a Bi superconducting oxide current lead for an RE123 superconducting current lead, however, the contact area between the terminal and the superconducting oxide ($O_2$-treated conductor) is small due to less cross sectional area, which causes higher Joule's heat at the interface.

When the cross sectional area of a current lead is to be made smaller using a material having a higher critical current density, like an RE123 superconducting oxide current lead, the contact resistance at the interface between the terminal and the superconducting oxide ($O_2$-treated conductor) needs to be made smaller. For example, when an about 10 mm long metal terminal is to be attached to the terminal of a YBCO superconducting oxide current lead having a diameter of 1.3 mm, which is capable of flowing a 1000 A current, the contact resistance needs to be not more than $10^{-12} \Omega m^2$.

A superconducting oxide and a normal conductor (e.g., metal) have been conventionally joined by sputtering. In recent years, a molten method superior in the contact resistance at the interface has been proposed (Quarterly Journal of the Japan Welding Society, vol. 14, No. 1, pp.162–167 (1996)). The molten method comprises once melting a normal conductor and adhering the molten normal conductor to a superconducting oxide to give a terminal.

In the proposed molten method, however, the metal component (particularly Cu) of the superconducting oxide sometimes melts out into the molten normal conductor, thereby forming a reaction layer at the interface between the superconducting oxide and the normal conductor. Since this reaction layer is not a superconductor, the contact resistance between the superconducting oxide and the normal conductor becomes strikingly high.

It is therefore an object of the present invention to provide a method for manufacturing a joint, particularly a superconducting oxide current lead, having a less contact resistance at the interface between the metal terminal and the superconducting oxide ($O_2$-treated conductor). Particularly, to provide a method for manufacturing a joint of a superconducting oxide ($O_2$-treated conductor) and a normal conductor, which is capable of inhibiting formation of a reaction layer at the interface between the superconducting oxide and normal conductor.

SUMMARY OF THE INVENTION

It has now been found according to the present invention that soaking of a superconducting oxide current lead in a molten normal conductor leads to an extremely easy manufacture of a metal terminal, wherein the contact resistance at the interface between the obtained metal terminal and the superconducting oxide has been reduced.

The production method of the joint, particularly a superconducting oxide current lead, of the present invention is characterized by soaking the terminal of a rod made of superconducting oxide in a molten normal conductor.

It has been also found that a reaction layer is inhibited when a substance containing the same metal components as in the superconducting oxide has been previously added to the molten normal conductor.

The production method of the joint of the present invention is characterized by soaking a part or the entirety of a member made of superconducting oxide in a molten normal conductor, to which a substance containing the same metal components as in the superconducting oxide has been previously added.

DETAILED DESCRIPTION OF THE INVENTION

The production method of the present invention is explained in detail by referring to the drawings wherein the joint is a superconducting oxide current lead.

Figure 1:
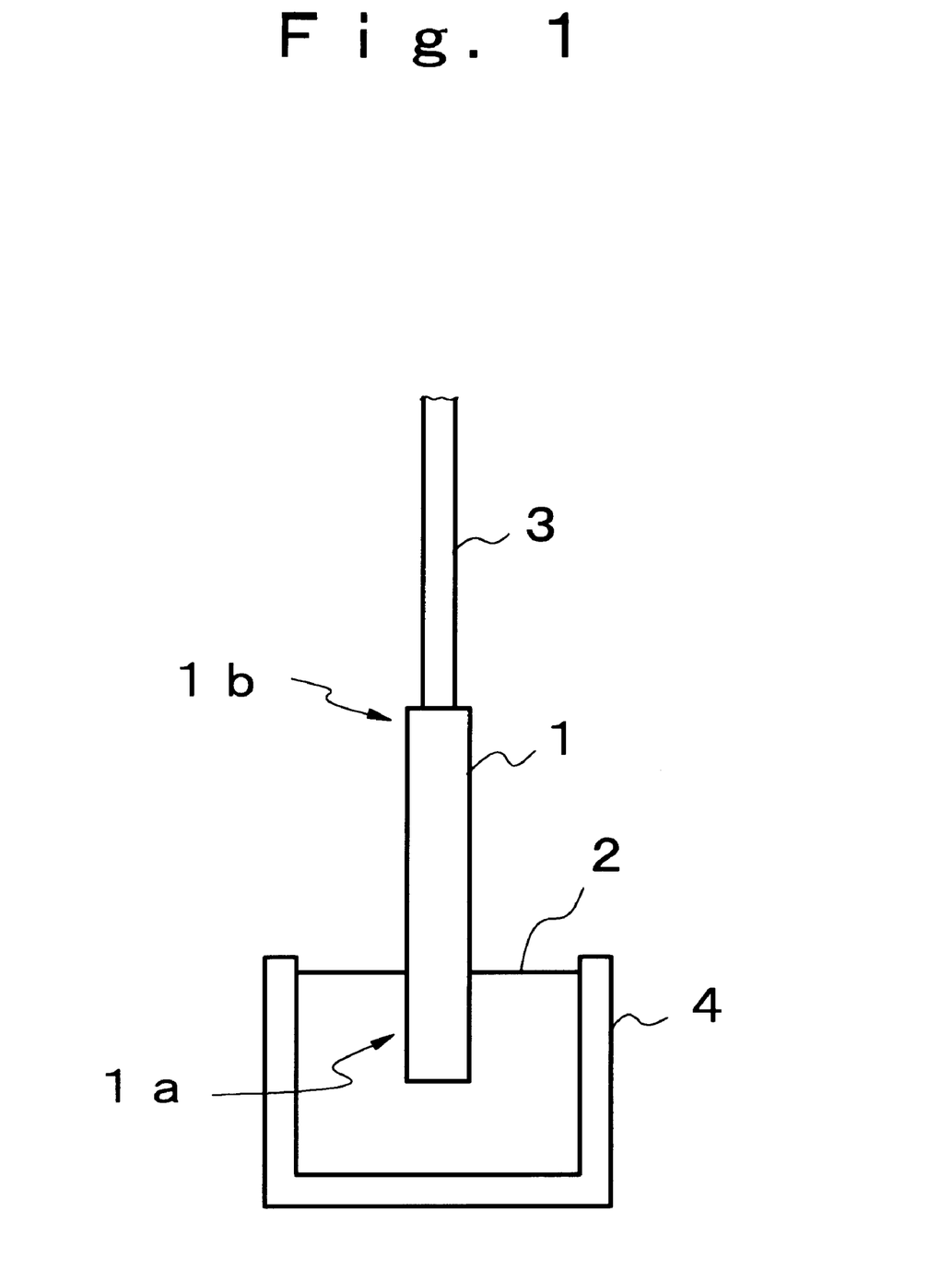
FIG. 1 shows one example of the production method of the joint of the present invention, wherein 1 is a rod, 1a is an end of the rod, and 2 is a normal conductor.

As shown in FIG. 1, the production method of a superconducting oxide current lead of the present invention comprises a step of soaking an end 1a of a rod 1 made of superconducting oxide in a molten normal conductor 2.

In the example shown in FIG. 1, rod 1 is a single crystal fiber made of a high temperature Y superconductor (YBCO) by unidirectional solidification, which has a circular cross section. A bar 3 of alumina ($Al_2O_3$) is attached to an end 1b of the rod 1 that is free from soaking. The normal conductor 2 is made of silver which hardly affects the superconducting state, which has a smaller resistance, and which is relatively economical.

The molten normal conductor 2 is stored in a crucible 4 made of alumina. The operation is done in an electric furnace (not shown) in the atmosphere. The temperature of the normal conductor 2 is set to not more than the peritectic temperature of the superconducting oxide that forms the rod 1. The soaking time of rod 1 in the normal conductor 2 is about 5 seconds.

Figure 2:
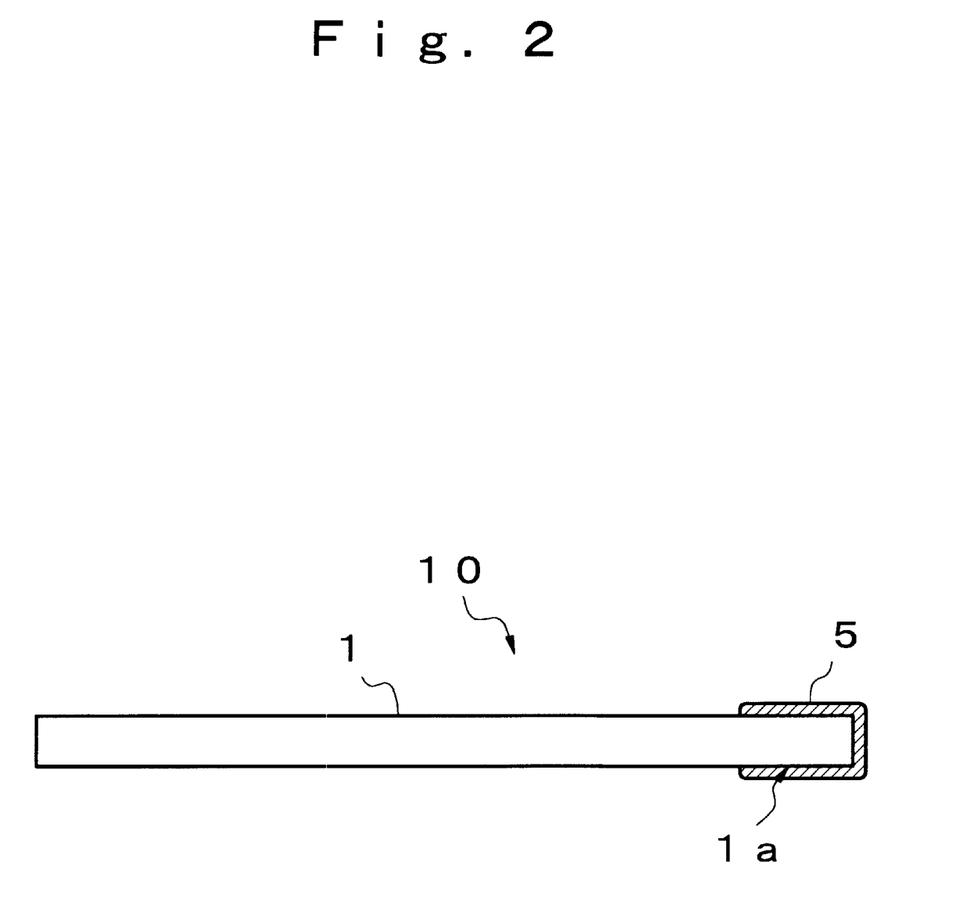
FIG. 2 is a cross section of a superconducting oxide current lead manufactured by the production method shown in FIG. 1.

According to the production method of the present invention, as shown in the example of FIG. 2, a terminal 5 of a normal conductor is formed on the end 1a of the rod 1 to manufacture a superconducting oxide current lead 10.

When an electrode is attached to a superconductor by allowing the superconductor to be wet with a molten metal in this manner, the molten metal and a superconductor are joined to minimize the interface energy between the two phases of the molten metal and the superconductor. As a result, the molten metal and the superconductor are joined firmly, and the contact resistance between the superconducting oxide (rod 1) and the terminal 5 at the interface can be reduced as compared to the use of conventional sputtering.

Therefore, the production method of the present invention is effective for manufacturing a superconducting oxide current lead having a small diameter, which is difficult to be improved in heat load due to a smaller contact area of the superconducting oxide and the terminal. Specifically, the method is particularly effective for a current lead that is a rod (with circular cross section) having a diameter of 0.1 mm–10 mm, preferably 0.5 mm–3 mm.

Figure 3:
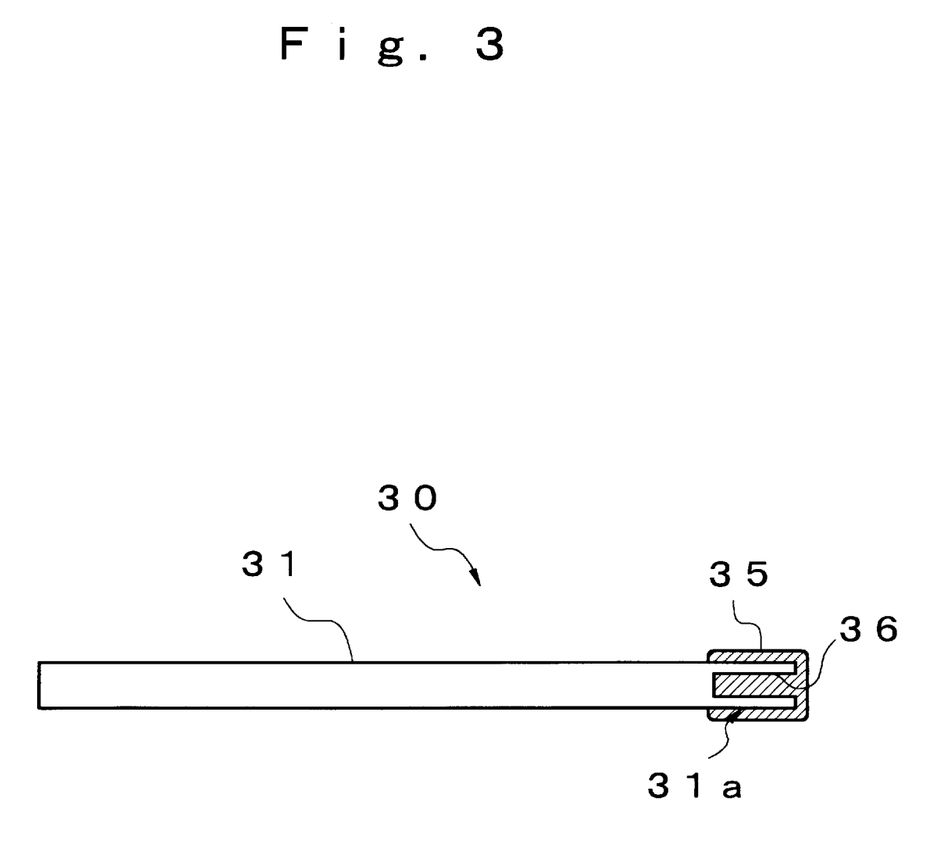
FIG. 3 is a cross section of another example of the superconducting oxide current lead manufactured by the production method of the present invention.

FIG. 3 is a cross section of another example of the superconducting oxide current lead manufactured by the production method of the present invention. The superconducting oxide current lead 30 shown in FIG. 3 was made in the same manner as in the embodiment shown in FIG. 1, except the shape of a rod 31. In the embodiment shown in FIG. 3, an end 31a of the rod 31 comprises a groove 36 formed along the longitudinal direction of the rod 31. The normal conductor is located inside the groove 36 and forms a terminal 35. The surface of the outer periphery of the rod 31 may be subjected to a sputtering treatment.

When the groove 36 is formed on the end 31a of the rod 31, the contact area of the rod 31 (superconducting oxide) and the terminal 35 increases, which in turn further reduces the total contact resistance. Moreover, since the terminal 35 has a sandwich structure wherein the normal conductor is located in between two layers of superconducting oxide, the mechanical properties (e.g., fracture toughness, flexural strength at terminal 35 and the like) can be improved, thereby inhibiting terminal fracture frequently observed in conventional current leads.

The material of the rod to be used in the production method of the present invention is not limited to YBCO but may be RE123 superconductor(rare earth superconducting oxide),Bi superconducting oxide, Tl superconducting oxide and the like.

Specific examples of RE123 superconductor include $Y_1Ba_2Cu_3O_x$ (YBCO), $Yb_1Ba_2Cu_3O_x$, $Dy_1Ba_2Cu_3O_x$, $Gd_1Ba_2Cu_3O_x$, $Sm_1Ba_2Cu_3O_x$, $Nd_1Ba_2Cu_3O_x$, and $(Yb,Y)_1Ba_2Cu_3O_x$, $(Nd,Y)_1Ba_2Cu_3O_x$ and $(Nd,Sm,Y)_1Ba_2Cu_3O_x$, the last three comprising rare earth element (mixed crystal).

Examples of Bi superconducting oxide include $Bi_2Sr_2Ca_1Cu_2O_x$ and $Bi_2Sr_2Ca_2Cu_3O_x$. Examples of Tl superconducting oxide include $Tl_2Sr_2Ca_1Cu_2O_x$, $Tl_2Sr_2Ca_2Cu_3O_x$, $Tl_1Sr_2Ca_2Cu_3O_x$ and the like.

The amount of oxygen in the above-mentioned examples wherein the superconducting oxide is an $O_2$-treated conductor is $6.5 \leq x \leq 8.0$ for RE123 superconductor (inclusive of mixed crystal), $7.5 \leq x \leq 8.5$ for $Bi_2Sr_2Ca_1Cu_2O_x$, $9.5 \leq x \leq 10.5$ for $Bi_2Sr_2Ca_2Cu_3O_x$, $7.5 \leq x \leq 8.5$ for $Tl_2Sr_2Ca_1Cu_2O_x$, $9.5 \leq x \leq 10.5$ for $Tl_2Sr_2Ca_2Cu_3O_x$ and $5.5 \leq x \leq 6.5$ for $Tl_1Sr_2Ca_2Cu_3O_x$.

The material for forming a normal conductor, i.e. terminal needs to be a metal that does not affect the superconducting state, because the superconducting oxide is highly sensitive to impurities and even a trace amount of an impurity degrades superconducting state. Examples of such metal include noble metals such as gold and silver, with utmost preference given to silver which has smaller resistance and which is economical. The normal conductor in the present invention is not in the superconducting state at a critical temperature at which superconducting oxide converts to a superconductor.

Of the above-mentioned superconducting oxide, an RE123 superconductor is preferably used in the present invention in view of high critical current density. Particularly preferable is YBCO because it has a superconducting phase of $RE_1Ba_2Cu_3O_x$ structure as a stoichiometry even under partial oxygen pressure and it is obtained relatively easily. When silver is used as a normal conductor, the above-mentioned superconducting oxide may contain silver, such as $Yb_1Ba_2Cu_3O_x/Ag$, $Y_1Ba_2Cu_3O_x/Ag$, $Nd_1Ba_2Cu_3O_x/Ag$, $Bi_2Sr_2Ca_2Cu_3O_x/Ag$ and the like. In such a case where the superconducting oxide contains silver, silver particles already present in the superconducting oxide and molten silver melt rather easily, which leads to a still lower contact resistance. The above-mentioned superconducting oxide may contain additives such as Pt and $CeO_2$.

The rod to be used in the production method of the present invention can be prepared by a conventional method such as unidirectional solidification and sintering. Taking the case where superconducting oxide is YBCO for example, unidirectional solidification is preferable. The unidirectional solidification is a kind of zone melt method wherein transfer of heat during solidification of the material occurs only unidirectionally. The rod obtained by unidirectional solidification of YBCO is a single crystal and due to less crystal particle intergranule, the superconducting current is less frequently prevented by the intergranule. The superconducting oxide prepared by unidirectional solidification is generally a precursor and needs to be converted to an $O_2$-treated conductor by an oxygen introduction treatment after soaking into a molten normal conductor.

In the production method of the present invention, it is not preferable to decompose, during soaking, the superconducting single crystal prepared by unidirectional solidification. According to the production method of the present invention, the temperature of the molten normal conductor is preferably set to not more than peritectic temperature of the superconducting oxide forming the rod. Therefore, the temperature of a molten normal conductor is preferably 940° C.–970° C. when using YBCO, 940° C.–1000° C. when using SmBCO and 940° C.–1020° C. when using NdBCO.

In the production method of the present invention, moreover, a normal conductor is particularly preferably molten and supercooled. Therefore, the temperature of the normal conductor is particularly preferably not more than peritectic temperature of the superconducting oxide and not more than the melting temperature (955° C. in atmosphere when the normal conductor is silver). In this case, the superconducting oxide (rod) becomes a kind of seed nucleus and massive molten normal conductor attaches to the surrounding of the superconducting oxide to form a terminal. Consequently, a still firm contact can be formed.

In the production method of the present invention, if the soaking time of a rod in a normal conductor becomes longer, a non-superconducting reaction layer is formed in the interface between the superconducting oxide and the terminal, and the contact resistance becomes significantly high. For example, when YBCO is used as the superconducting oxide and silver is used as the normal conductor, Cu melts out into the molten silver from $Y_1Ba_2Cu_3O_x$ superconductor, and a Cu-poor reaction layer is formed between $Y_1Ba_2Cu_3OX$ and molten silver. Thus, according to the production method of the present invention, the soaking time should be short enough to prevent formation of a reaction layer or may be long on the assumption that a subsequent recrystallization treatment is applied that will decompose the reaction layer.

When the soaking time is short, the rod needs to be pulled out before the aforementioned reaction layer starts to form. Therefore, the time is from 0.1 sec to 60 sec, preferably from 1 sec to 10 sec, after ceramics (superconducting oxide) and silver start to get wet. When the soaking time is long, a reaction layer having a uniform thickness of about $20\mu m$–$100 \mu m$ is preferably formed, which is from 0.1 hr to 5 hr, preferably from 0.5 hr to 2 hr, after ceramics (superconducting oxide) and silver start to get wet.

The recrystallization treatment to be performed in the production method of the present invention may comprise heating again the rod pulled out from the normal conductor in a heating furnace, such as a box-shaped electric furnace, to re-melt the attached normal conductor and to gradually cool same to allow recrystallization.

For example, when the rod is YBCO and the normal conductor is silver, the recrystallization treatment comprises (1) placing the rod with silver attached thereto in a heating furnace, (2) heating the rod to elevate the temperature in the atmosphere from room temperature to about $T_{max}$=950° C.–985° C. over about one hour, and (3) gradually cooling the rod to a temperature which is about 5° C.–50° C. lower than $T_{max}$ during the aforementioned heat elevation, over about 10–100 hours.

Figure 4:
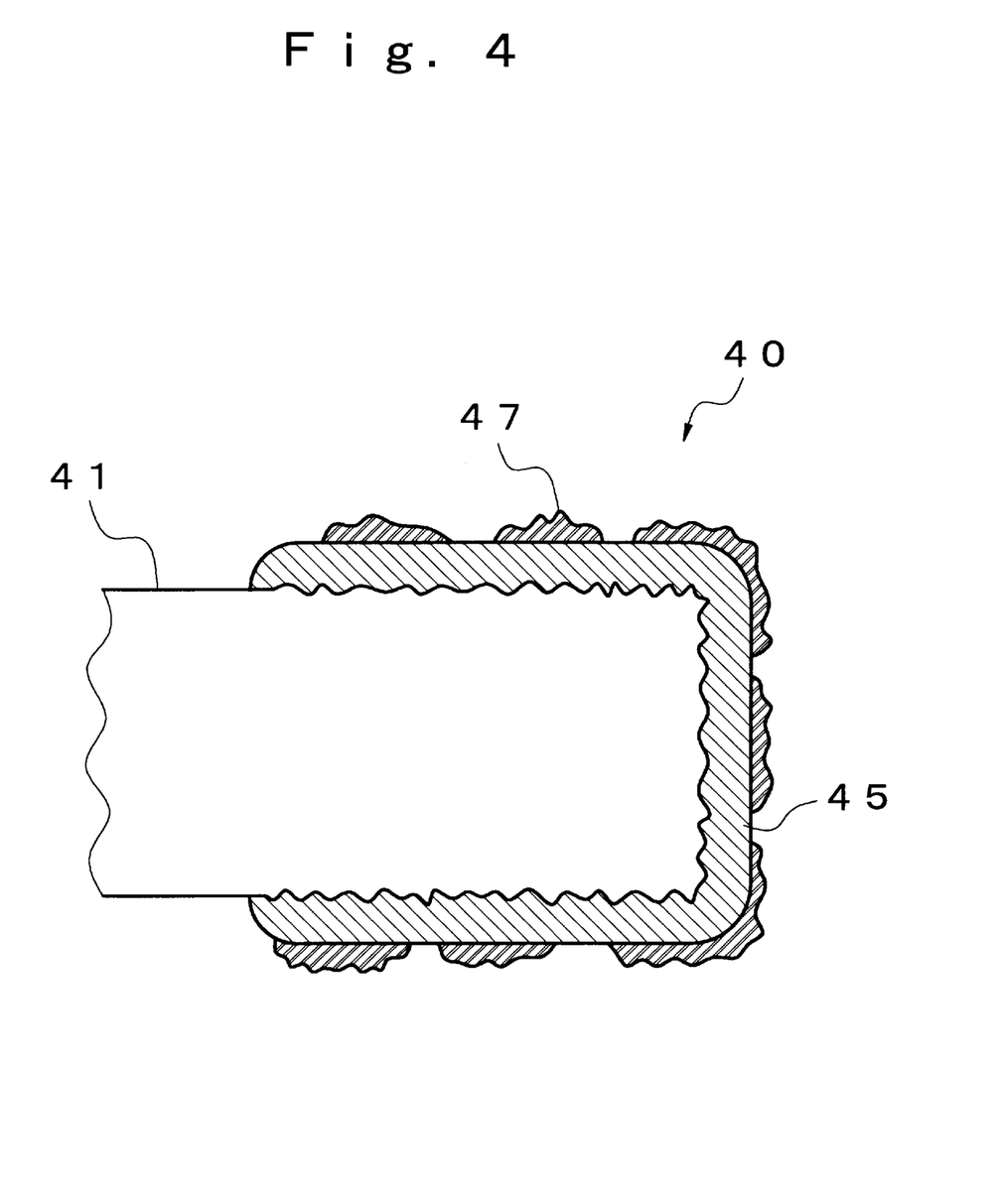
FIG. 4 is a cross section of another example of the superconducting oxide current lead manufactured by the production method of the present invention.

FIG. 4 is a cross section of another example of the superconducting oxide current lead manufactured by the production method of the present invention. In this Figure, the vicinity of the rod end is enlarged. The superconducting oxide current lead 40 shown therein was prepared by soaking the rod 41 made of superconducting oxide in a molten normal conductor for about one hour and applying a recrystallization treatment. The rod 41 is a YBCO single crystal fiber and the normalconductor forming the terminal 45 is silver. This single crystal fiber is a precursor immediately after a single crystallization treatment. Therefore, the single crystal fiber needs to be converted to an $O_2$-treated conductor by an oxygen introduction treatment after the recrystallization treatment.

After recrystallization treatment, a reaction layer does not exist at the interface between the rod 41 and the terminal 45. The interface has irregularities and the contact area between the rod 41 and the terminal 45 has increased. By 47 is denoted $Ba$-$Cu$-$O_x$ generated upon decomposition of the reaction layer, which is present on the surface of the terminal 45. The $Ba$-$Cu$-$O_x$ can be removed easily by polishing the surface. The superconducting oxide current lead 40 prepared by a recrystallization treatment can reduce the contact resistance, because the reaction layer at the interface has been decomposed and the contact area has been increased.

The atmosphere in which the production method of the present invention is applied is not particularly limited. The production method of the present invention can be carried out in, for example, the atmosphere or oxygen atmosphere. For example, when the superconducting oxide is YBCO which is a stoichiometric material without solid solution, a $Y_1Ba_2Cu_3O_x$ superconducting phase can be obtained in any oxygen atmosphere. When it is SmBCO or NDBCO, the inventive method is preferably applied under a partial oxygen pressure of 0.01 atm.

The method of the present invention for obtaining a joint having no reaction layer formed on the contact surface between the superconducting oxide and normal conductor is explained in detail in the following by referring to the drawings.

This method of joining a superconducting oxide and a normal conductor comprises a step of soaking a part or the entirety of a member made of the superconducting oxide in the molten normal conductor to which a substance containing the same metal components as in the superconducting oxide has been previously added. In the embodiment shown in FIG. 1, a superconducting oxide having the same composition as the superconducting oxide forming the rod 1 i.e., high temperature Y superconductor, is powdered and melted in a crucible 4 together with a normal conductor and the rod 1 is soaked therein to practice the joining method of the present invention. In this case, a superconducting oxide current lead similar to the one shown in FIG. 2 can be prepared.

The shape of the member to be used in the present invention may be any as long as it fits the purpose of use of the member. For example, when it is a superconducting oxide current lead as shown in FIG. 2, the member is a fiber or rod as in the embodiments shown in FIGS. 1 and 2.

This joining method can be applied to any use as long as it concerns joining of a superconducting oxide (particularly $O_2$-treated conductor) and a normal conductor. It is preferably applied to the preparation of the above-mentioned superconducting oxide current lead.

According to this joining method, the superconducting oxide, from which a member to be soaked is prepared, includes, as in the case of the aforementioned inventive production method, RE123 superconductor (rare earth superconducting oxide) which is typically YBCO, Bi superconducting oxide, Tl superconducting oxide and the like.

When a superconducting oxide current lead is prepared according to this joining method as shown in FIG. 2, an RE123 superconductor, specifically YBCO, is particularly preferably used.

When silver is used as the normal conductor in this joining method, the superconducting oxide preferably contains silver.

According to this joining method, the superconductor needs to be a metal that does not affect the superconducting state, because the superconducting oxide is highly sensitive to impurities and even a trace amount of an impurity degrades the superconducting state. Examples of such metal include noble metals such as gold and silver, with utmost preference given to silver which has smaller resistance and which is economical.

The substance to be added to the molten normal conductor according to this joining method may be any as long as it contains the same metal components as in the superconducting oxide. Such substance may have the same composition as the component of the superconducting oxide, i.e., the same composition as the metal component of the superconducting oxide, and an oxygen component.

For example, when the superconducting oxide forming the member is an RE123 superconductor (rare earth superconducting oxide), a substance containing at least RE, Ba and Cu is used. To prevent the superconducting oxide to be converted to a different phase, however, the RE, Ba, Cu composition ratio of this substance is preferably RE:Ba:Cu= 1.0–2.0:2.0–2.5:3.0–3.5. More specifically, $RE_{1.2}Ba_{2.1}Cu_{3.1}O_x$ and $RE_{1.8}Ba_{2.4}Cu_{3.4}O_x$ are used, which are mixtures of $RE_2Ba_1Cu_1O_5$ and $RE_1Ba_2CU_3O_x$, having the same composition as the superconducting oxide forming the member.

According to this joining method, however, the substance to be added to the molten normal conductor is preferably a superconducting oxide having the same composition as the superconducting oxide forming the member, in view of easy preparation and easy powdering. Note that, in the present invention, by the same composition is meant the same components and the same ratio of the components.

According to this joining method, the substance can be added to the normal conductor before or after melting the normal conductor. For easy addition, it is preferably added before melting. The substance may be a powder, particle or mass, without any particular limitation. However, it is preferably added in the form of a powder because it is easily melted in the molten normal conductor. The amount to be added is 0.5 part by weight–20 parts by weight, preferably 5 parts by weight–10 parts by weight, per 100 parts by weight of the normal conductor.

According to this joining method, like the aforementioned production method of the present invention, the temperature of the molten normal conductor is preferably not more than peritectic temperature of this superconducting oxide, to prevent decomposition of the superconducting oxide.

According to this joining method, the lower limit of the soaking time of the member made of superconducting oxide in a normal conductor needs to be not less than the time necessary for the superconducting oxide to get wet with the normal conductor, which is not less than 0.1 sec. While the upper limit of the soaking time is not particularly limited, approximately 1 hr will be enough. Therefore, the soaking time according to this joining method is preferably about 0.1 sec to 1 hr.

This joining method can be performed in the atmosphere or oxygen atmosphere, without particular limitation. According to this joining method, when the superconducting oxide constituting the member is YBCO, a joint can be formed while suppressing the formation of a reaction layer in any oxygen atmosphere. According to this joining method, when the superconducting oxide constituting the member is SmBCO or NdBCO, the method is preferably performed under a low oxygen atmosphere (partial oxygen pressure of not more than 0.02 atm).

The production method of the joint of the present invention is explained in more detail in the following by way of Examples, to which the present invention is not limited.

EXAMPLE 1

According to the joining method as shown in FIG. 1, a superconducting oxide current lead was prepared. As the normal conductor, silver was used and the soaking step was carried out in an electric furnace in the atmosphere. First, a YBCO single crystal fiber (diameter 1.5 mm) was prepared by unidirectional solidification and used as a rod. Then, silver to be the terminal was melted, and the temperature thereof was set to 950° C., at which temperature the molten silver was in a supercooled state.

The rod was soaked for 5 sec in the molten silver (liquid silver), and immediately thereafter pulled up and taken out from the furnace. Silver was attached to an end of the rod that was a superconducting oxide. The thickness of the silver was 30$\mu$m–40$\mu$m. Then, this sample was subjected to an oxygen introduction treatment in an oxygen atmosphere (partial oxygen pressure 1 atm) at 500° C. for 700 hours. Using this as an $O_2$-treated conductor, a superconducting oxide current lead was obtained. A direct current was flown through this superconducting oxide current lead, and the contact resistance was calculated from the generated voltage. As a result, the contact resistance was about $10^{-12}$ $\Omega m^2$.

EXAMPLE 2

According to the production method as shown in FIG. 1, a superconducting oxide current lead as shown in FIG. 3 was prepared. In the same manner as in Example 1, silver was used as the normal conductor, and the soaking step was carried out in an electric furnace in the atmosphere. First, four YBCO single crystal fibers (diameter 1.5 mm) were prepared by unidirectional solidification and used as rods. Then, as shown in FIG. 3, a groove was formed on each rod. The groove was formed with a diamond blade in a width of 0.3 mm and the length in the longitudinal direction of 4–5 mm. The silver to be the terminal was melted in a crucible, and the temperature of the liquid silver in the crucible was set to 950° C., 957° C., 966° C. and 970° C., respectively for the rods.

The rods were soaked for 5 sec in the molten silver (liquid silver), and immediately thereafter pulled up and taken out from the furnace. As a result, silver was also attached to the groove of each rod. The surface of the outer periphery of the rod 31 was subjected to a sputtering treatment. The thickness of the silver on the outer periphery was 50μm–100 μm.

Then, these samples were subjected to an oxygen introduction treatment in an oxygen atmosphere (partial oxygen pressure 1 atm) at 500° C. for 700 hours. Using these as $O_2$-treated conductors, superconducting oxide current leads were obtained. The contact resistance was calculated in the same manner as in Example 1. As a result, the contact resistance was about $10^{-12}$ $\Omega m^2$.

EXAMPLE 3

A superconducting oxide current lead as shown in FIG. 4 was prepared. In the same manner as in Example 1, silver was used as the normal conductor, and the soaking step was carried out in an electric furnace in the atmosphere. First, four YBCO single crystal fibers (diameter 1.5 mm) were prepared by unidirectional solidification and used as rods. Then, silver to be the terminal was melted in a crucible, and the temperature of the liquid silver in the crucible was set to 949° C., 951° C., 957° C. and 962° C., respectively for the rods.

The rods were soaked for 1 hr in the molten silver (liquid silver), and immediately thereafter pulled up and taken out from the furnace. As a result, silver was attached to the end of each rod and a reaction layer was formed in the interface between the rod and the silver. The composition of this reaction layer was about Y:Ba:Cu=1:2:1.5. The results confirmed that Cu had melted out from $Y_1Ba_2Cu_3O_x$ constituting the rod into the liquid silver.

Then, using a muffle furnace (electric resistance heating box furnace), a recrystallization treatment was carried out. The recrystallization treatment comprised elevating the temperature of the atmosphere to 970° C. over one hr, then rapidly cooling to 960° C. over one min, and gradually cooling to 960° C.–940° C. over 40 hr, which was followed by cooling in the furnace. As a result, the reaction layer was decomposed into $Y_2Ba_1Cu_1O_x$ and $Ba-Cu-O_x$, wherein $Y_2Ba_1Cu_1O_x$ was taken into the molten silver, and the other unnecessary $Ba-Cu-O_x$ was on the surface. This $Ba-Cu-O_x$ could be easily removed.

The interface between the rod and the silver was observed with an electron microscope. As a result, drastic irregularities were observed, which means that the contact area increased at the interface. These samples were subjected to an oxygen introduction treatment in an oxygen atmosphere (partial oxygen pressure 1 atm) at 500° C. for 700 hours. Using these as $O_2$-treated conductors, superconducting oxide current leads were obtained. The contact resistance of the superconducting oxide current leads was calculated in the same manner as in Example 1. The contact resistance was as low as about $10^{-13}$ $\Omega m^2$–$10^{-12}$ $\Omega m^2$.

COMPARATIVE EXAMPLE 1

First, a YBCO single crystal fiber (diameter 1.5 mm) was prepared by unidirectional solidification in the same manner as in Example 1. Then, silver was adhered to an end of the fiber by sputtering. The thickness of the silver film was 50μm–100μm. Then, this sample was subjected to an oxygen introduction treatment in an oxygen atmosphere (partial oxygen pressure 1 atm) at 500° C. for 700 hours to give an $O_2$-treated conductor, whereby a superconducting oxide current lead was prepared. The contact resistance of this superconducting oxide current lead was calculated in the same manner as in Example 1. As a result, the contact resistance was about $10^{-9}$ $\Omega m^2$–$10^{-10}$ $\Omega m^2$.

The results of the above-mentioned Examples and Comparative Example confirmed that, when the production method of the present invention is used to produce a superconducting oxide current lead, the contact resistance at the interface between a superconducting oxide (particularly $O_2$-treated conductor) and a normal conductor (terminal) can be reduced as compared to conventional methods.

As demonstrated, the use of the production method of the present invention leads to the reduction of the contact resistance at the interface between a superconducting oxide (particularly $O_2$-treated conductor) and a normal conductor. Consequently, Joule's heat at a current lead having a small cross sectional area can be suppressed low, which in turn realizes the reduction of the load on a freezer and the amount of evaporated cooling solvent, with respect to a superconducting coil.

EXAMPLE 5

A superconducting oxide current lead as shown in FIG. 2 was prepared as in the following. Silver (95 parts by weight) and YBCO powder (5 parts by weight) were mixed and the mixture was placed in an alumina crucible. The mixture was melted in an electric furnace in the atmosphere. Then, the temperature of the molten liquid was maintained at 940° C.–970° C., and one end of a YBCO single crystal fiber (diameter 1.5 mm) prepared by unidirectional solidification was soaked for about one hour. Then, the fiber was pulled up and subjected to an oxygen introduction treatment in an oxygen atmosphere (partial oxygen pressure 1 atm) at 500° C. for 700 hours to give an $O_2$-treated conductor, whereby the superconducting oxide current lead was completed.

The interface between the rod and the silver of the above mentioned superconducting oxide current lead was observed with an electron microscope. As a result, a reaction layer was not found. A direct current was flown through this superconducting oxide current lead, and the contact resistance was calculated from the generated voltage. As a result, the contact resistance was as low as about $10^{-12}$ $\Omega m^2$.

COMPARATIVE EXAMPLE 2

In the same manner as in Example 5 except that silver alone was placed in an alumina crucible and melted, a superconducting oxide current lead was completed. The interface between the superconducting oxide and the silver of the above-mentioned superconducting oxide current lead was observed with an electron microscope. As a result, a reaction layer poor in Cu had been formed at the interface between the superconducting oxide and the normal conductor. The contact resistance was calculated in the same manner as in Example 5. As a result, the contact resistance was about $10^{-6}\Omega m^2$–$10^{-5}$ $\Omega m^2$.

As demonstrated, the present invention can suppress the formation of a reaction layer at the interface between a superconducting oxide (particularly $O_2$-treated conductor) and a normal conductor. According to the joining method of the present invention, a superconducting oxide current lead having a small contact resistance between a terminal and a superconducting oxide can be manufactured easily.

This application is based on application Nos. 323951/1998 and 053970/1999 filed in Japan, the contents of which are incorporated hereinto by reference.

What is claimed is:

1. A method for producing a joint comprising a superconducting oxide and a normal conductor, which comprises soaking an end of a rod formed from the superconducting oxide in a molten normal conductor, wherein the molten normal conductor comprises a substance containing the same metal components as in the superconducting oxide.

2. The method of claim 1, wherein the joint is a superconducting oxide current lead.

3. The method of claim 1, wherein the rod is soaked for a period of from 0.1 second to 60 seconds.

4. The method of claim 1, wherein the rod is soaked for 0.1 hour to 5 hours, and which method further comprises heating and gradually cooling the rod after soaking in the molten normal conductor.

5. The method of claim 1, wherein the rod is a single crystal fiber formed from a rare earth superconducting oxide by unidirectional solidification.

6. The method of claim 1, wherein the normal conductor is silver.

7. The method of claim 1, wherein the rod has a circular cross section having a diameter of 0.1 mm–10 mm.

8. A method for producing a joint comprising a superconducting oxide and a normal conductor, which comprises soaking an end of a rod formed from the superconducting oxide in a molten normal conductor which is in a supercooled state and wherein the molten normal conductor has a temperature of not more than a peritectic temperature of the superconducting oxide forming the rod and not more than a melting temperature of the normal conductor.

9. A method for producing a joint comprising a superconducting oxide and a normal conductor, which comprises soaking an end of a rod formed from the superconducting oxide in a molten normal conductor, wherein the rod has a groove formed on an end thereof.

10. The method of claim 9, wherein the joint is a superconducting oxide current lead.

11. The method of claim 9, wherein the rod is soaked for a period of from 0.1 second to 60 seconds.

12. The method of claim 9, wherein the rod is soaked for 0.1 hour to 5 hours, and which method further comprises heating and gradually cooling the rod after soaking in the molten normal conductor.

13. The method of claim 9, wherein the rod is a single crystal fiber formed from a rare earth superconducting oxide by unidirectional solidification.

14. The method of claim 9, wherein the normal conductor is silver.

15. The method of claim 9, wherein the rod has a circular cross section having a diameter of 0.1 mm–10 mm.

16. A method for producing a joint comprising a superconducting oxide and a normal conductor, which comprises soaking an end of a rod formed from the superconducting oxide in a molten normal conductor, wherein a part or the entirety of the rod is soaked in the molten normal conductor to which a substance having the same composition as the metal components of the superconducting oxide has been previously added.

17. The method of claim 16, wherein the joint is a superconducting oxide current lead.

18. The method of claim 16, wherein the rod is soaked for a period of from 0.1 second to 60 seconds.

19. The method of claim 16, wherein the rod is soaked for 0.1 hour to 5 hours, and which method further comprises heating and gradually cooling the rod after soaking in the molten normal conductor.

20. The method of claim 16, wherein the rod has a circular cross section having a diameter of 0.1 mm–10 mm.

21. The method of claim 16, wherein the substance has the same components as those of the superconducting oxide.

22. The method of claim 16, wherein the substance is a superconducting oxide.

23. The method of claim 22, wherein the substance is added in an amount of 0.5 part by weight–20 parts by weight, per 100 parts by weight of the normal conductor.

24. The method of claim 16, wherein the rod is a single crystal fiber made of a rare earth superconducting oxide by unidirectional solidification.

25. The method of claim 16, wherein the normal conductor is silver.

26. The method of claim 16, wherein the normal conductor has a temperature of not more than a peritectic temperature of the superconducting oxide.

* * * * *